(12) United States Patent
Wu

(10) Patent No.: US 8,766,460 B2
(45) Date of Patent: Jul. 1, 2014

(54) PACKAGE WITH INTERPOSER FRAME AND METHOD OF MAKING THE SAME

(75) Inventor: Jiun Yi Wu, Zhongli (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 11 days.

(21) Appl. No.: 13/448,796

(22) Filed: Apr. 17, 2012

(65) Prior Publication Data

US 2013/0200512 A1    Aug. 8, 2013

Related U.S. Application Data

(60) Provisional application No. 61/604,414, filed on Feb. 28, 2012, provisional application No. 61/594,141, filed on Feb. 2, 2012.

(51) Int. Cl.
  *H01L 23/12* (2006.01)
  *H01L 23/52* (2006.01)
  *H01L 29/40* (2006.01)

(52) U.S. Cl.
  USPC ................. 257/778; 257/686; 257/777

(58) Field of Classification Search
  USPC ............... 257/686, 774, 777, 701, 778
  See application file for complete search history.

(56) References Cited

U.S. PATENT DOCUMENTS

| 7,230,330 | B2 * | 6/2007 | Lee et al. | 257/686 |
| 7,728,429 | B2 * | 6/2010 | Aokura et al. | 257/734 |
| 7,755,181 | B2 * | 7/2010 | Han et al. | 257/686 |
| 8,101,985 | B2 * | 1/2012 | Hierlemann | 257/303 |
| 8,115,292 | B2 * | 2/2012 | Toh et al. | 257/686 |
| 8,283,767 | B1 * | 10/2012 | Berry | 257/686 |

OTHER PUBLICATIONS

CJ, Bill, et al., "Advanced QFN Packaging for Low Cost and Solution", 2010 11th International Conference on Electronic Packaging Technology & High Density Packaging, pp. 45-49.
Lim, L. A., et al., "DreamPAK—Small Form Factor Package", EMPC 2009, pp. 1-6.
Tseng, Andy, et al, "Advanced QFN Surface Mount Application Notes Development", 2010 12th Electronics Packaging Technology Conference, pp. 737-742.
Servais, G. E., et al., "Wire Bonding—A Closer Look", The 17th International Symposium for Testing & Failure Analysis, Nov. 11-15, 1991, pp. 525-529.

\* cited by examiner

*Primary Examiner* — S. V. Clark
(74) *Attorney, Agent, or Firm* — Lowe Hauptman & Ham, LLP

(57) ABSTRACT

Embodiments of mechanisms of utilizing an interposer frame to form a package using package on package (PoP) technology are provided in this disclosure. The interposer frame is formed by using a substrate with one or more additives to adjust the properties of the substrate. The interposer frame has through substrate holes (TSHs) lined with conductive layer to form through substrate vias (TSVs) with solder balls on adjacent packages. The interposer frame enables the reduction of pitch of TSVs, mismatch of coefficients of thermal expansion (CTEs), shorting, and delamination of solder joints, and improves mechanical strength of the PoP package.

20 Claims, 13 Drawing Sheets

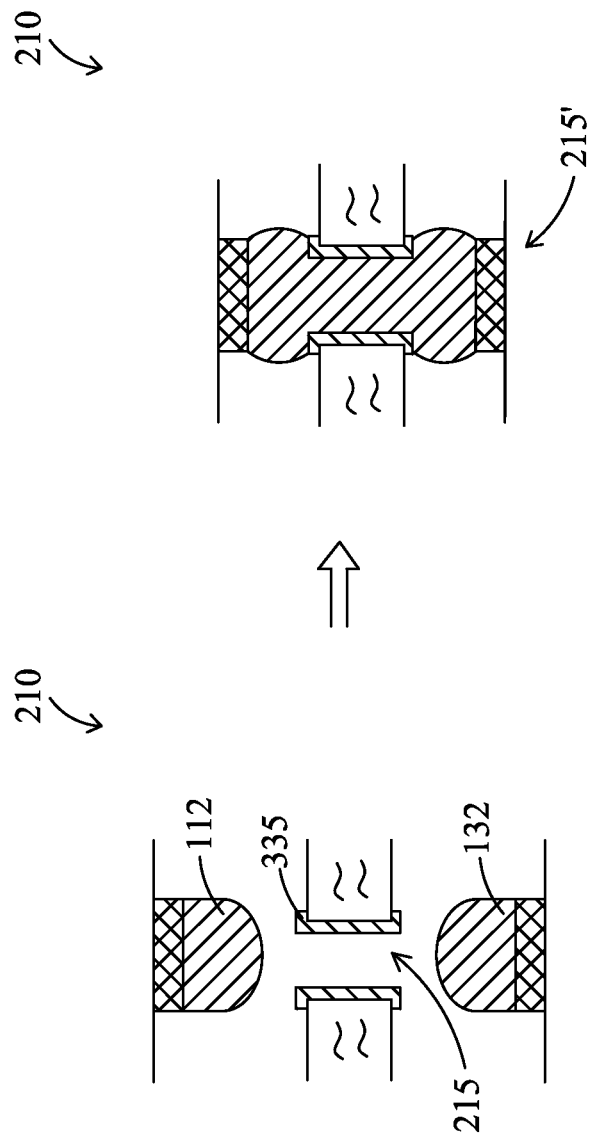

PACKAGE WITH INTERPOSER FRAME AND METHOD OF MAKING THE SAME

CROSS-REFERENCE TO RELATED APPLICATIONS

This application claims the priority of U.S. Provisional Application No. 61/604,414, filed Feb. 28, 2012 and is related to U.S. Provisional Application No. 61/594,141, filed on Feb. 2, 2012, which are incorporated by reference herein in their entireties.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less areas or heights than packages of the past, in some applications.

Thus, new packaging technologies, such as wafer level packaging (WLP) and package on package (PoP), have begun to be developed. These relatively new types of packaging technologies for semiconductors face manufacturing challenges.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 4A is a cross-sectional view of a through substrate hole (TSH) of an interposer frame being placed between a solder ball of a package and another solder ball of another substrate, in accordance with some embodiments.

FIG. 4B is a cross-sectional view of the structures of FIG. 4A after the packages being pressed together and reflowed, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are illustrative and do not limit the scope of the disclosure.

Figure 1A:
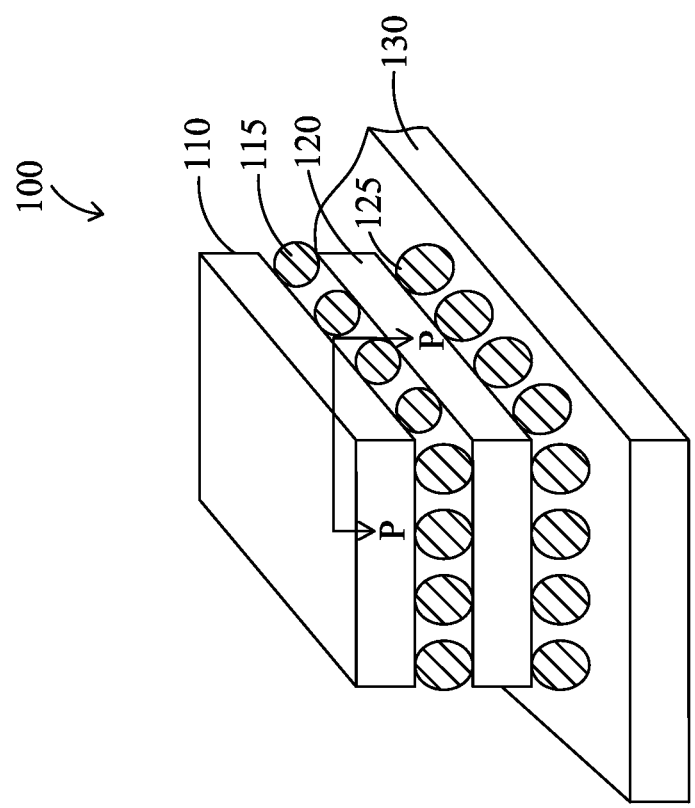
FIG. 1A is a perspective view of a package using the PoP technology (also referred to as "a PoP package") including a package bonded to another package, which is further bonded to a substrate in accordance with some embodiments.

FIG. 1A is a perspective view of a PoP package 100 including a package 110 bonded to another package 120, which is further bonded to a substrate 130 in accordance with some embodiments. Each package, such as package 110 or package 120, includes at least a semiconductor die (not shown). The semiconductor die includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Substrate 130 may be made of a semiconductor wafer, or a portion of wafer. In some embodiments, substrate 130 includes silicon, gallium arsenide, silicon on insulator ("SOI") or other similar materials. In some embodiments, substrate 130 also includes passive devices such as resistors, capacitors, inductors and the like, or active devices such as transistors. In some embodiments, substrate 130 includes additional integrated circuits. Substrates 130 may further include through substrate vias (TSVs) and may be an interposer. In addition, the substrate 130 may be made of other materials. For example, in some embodiments, substrate 130 is a multiple-layer circuit board. In some embodiments, substrate 130 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

Figure 1B:
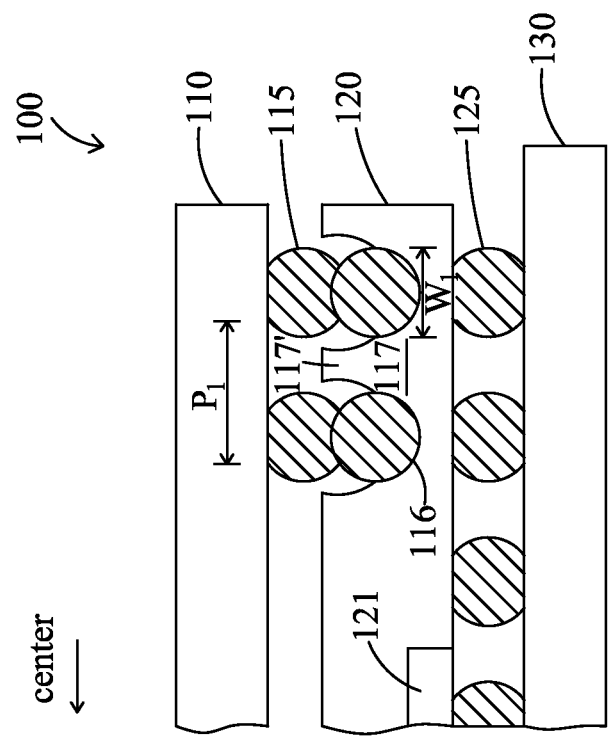
FIG. 1B is a cross-sectional view of a portion of the PoP package of FIG. 1A cut along line P-P, in accordance with some embodiments.

Package 110 is bonded to package 120 via connectors 115, and package 120 is bonded to substrate 130 via connectors 125. FIG. 1B is a cross-sectional view 150 of a portion of the PoP package of FIG. 1A cut along line P-P, in accordance with some embodiments. FIG. 1B shows connectors 115 and 125 near the edge of chip package 100. FIG. 1B also shows a semiconductor die 121 of package 120. There are connectors 125 near the center of package 120, in some embodiments. A portion of connectors 115 is formed in openings 116 of package 120. Openings 116 are formed by etching the molding material of package 120. As a result, connectors 115 may also be called through molding vias (TMVs). In some embodiments, the openings 116 are formed by laser drills, and the width $W_1$ of openings 116 is quite large. For example, the width $W_1$ is in a range from about 300 μm to about 600 μm, in accordance with some embodiments. In some embodiments, pitch $P_1$ between two adjacent connectors 115 is in a range from about 400 μm to about 800 μm. The relatively large pitch limits design flexibility and complexity that are needed for advanced devices. In addition, laser drill of openings 116 leaves the isolation regions 117 between connectors 115 relatively thin in the top portions 117', which increase the risk of shorting between connectors 115. Therefore, there is a need of finding alternative mechanisms for forming connectors 115 between package 110 and package 120.

Recently, packaging frames become available for integrated circuit (IC) packaging. These packaging frames have conductive columns with thermal dissipation function similar to through substrate vias and are fit around packaged dies. Because the packaging frames are fixed around packaged dies, the form factor is smaller than interposers. The examples of such packaging frames include, but are not limited to, DreamPak of ASM Pacific Technology Ltd. of Singapore, and Leadless-aQFN by ASE Inc. of Taipei, Taiwan.

Figure 2:
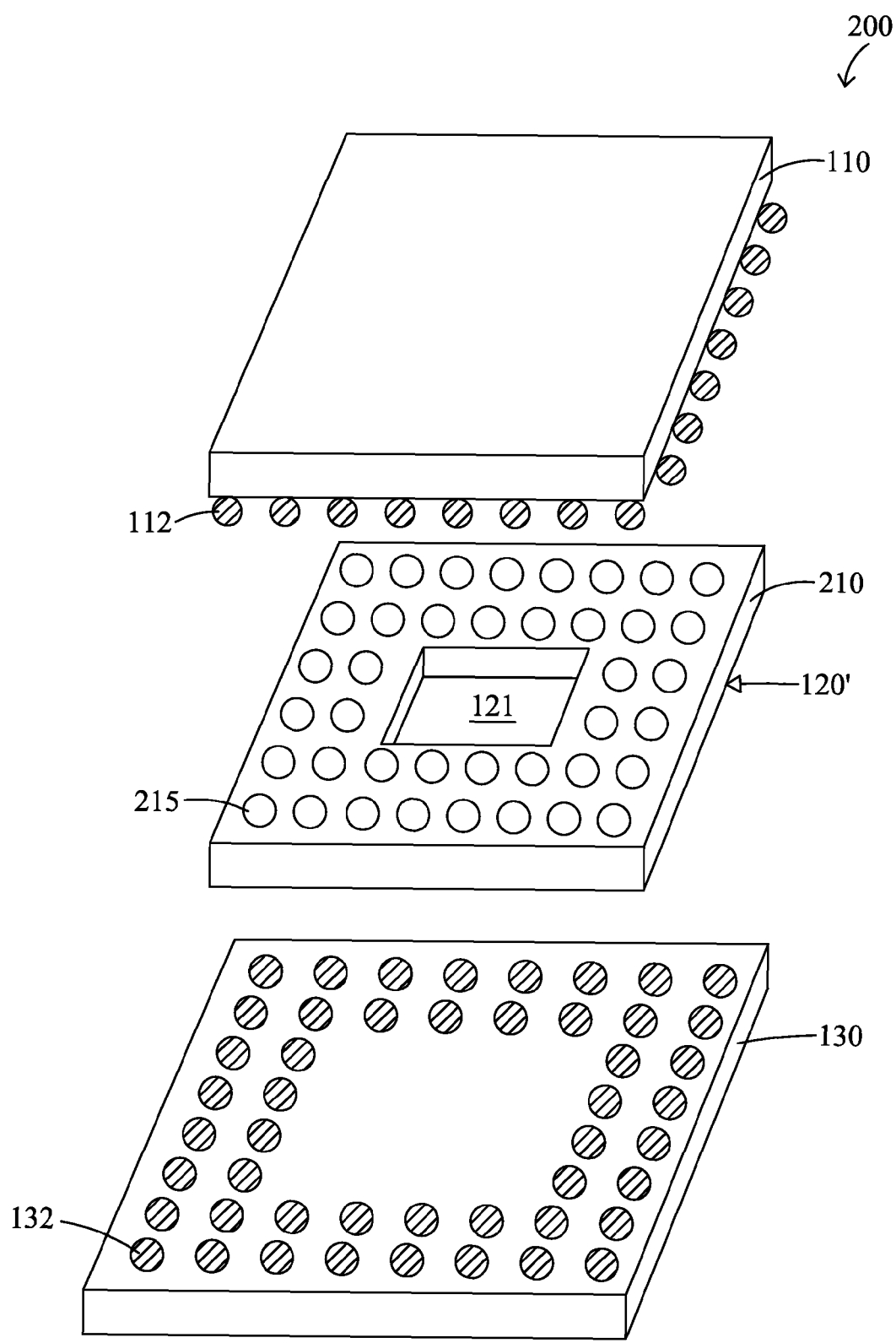
FIG. 2 is an exploded view of a PoP package including a package over another package, which is over yet another package in accordance with some embodiments.

FIG. 2 is an exploded view of a PoP package 200 including package 110 over package 120', which is over package 130, in accordance with some embodiments. Package 110 and substrate 130 have been described above. FIG. 2 shows package 120' that includes a semiconductor die 121, which is surrounded by an interposer frame 210. The interposer frame 210 has through substrate holes (TSHs) 215, which allow the bumps (or balls) 112 on package 110 to bond with bumps (or balls) 132 of substrate 130. Portions of bumps 112 and portions of bumps 132 reflow to fill the through substrate holes (TSHs) 215 to form connectors that electrically couple the package 110, the substrate, and/or the die 121. The TSHs may be formed by mechanical drill or by laser drill and the width of the openings can be made smaller than TMVs described above. In some embodiments using the laser drill technology, it is easier to form a through substrate hole in a substrate within a given area constraint than forming an opening in the substrate. Therefore, in some embodiments, the width of TSHs by laser drill ranges from about 50 μm to about 250 μm, which is smaller than width $W_1$ of TMVs described above. The smaller width of TSHs and the bonding process enable the pitch of the connectors on interposer frame 210 to be smaller than pitch $P_1$ of connector 115 described above. In some embodiments, the pitch of connectors on interposer frame 210 may be in a range from about 75 μm to about 500 μm. In some embodiments, the pitch of connectors on interposer frame 210 may be in a range from about 75 μm to about 300 μm.

Figure 3A:
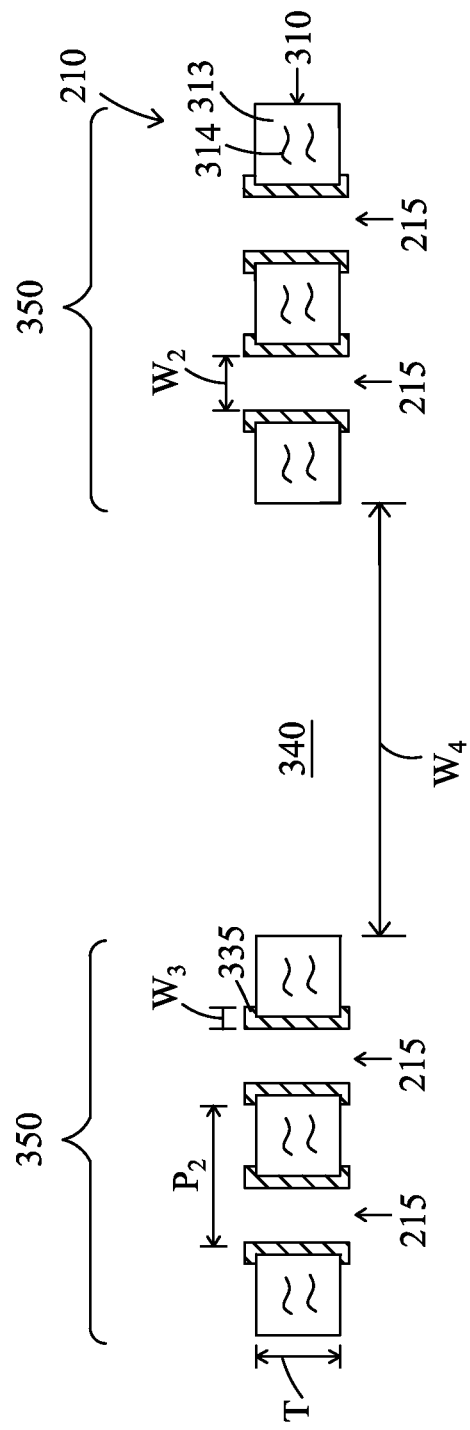
FIG. 3A is a cross-sectional view of an interposer frame, in accordance with some embodiments.

FIG. 3A is a cross-sectional view of an interposer frame 210, in accordance with some embodiments. The interposer frame Interposer frame 210 includes a substrate 310. Substrate 310 comprises a dielectric material. In some embodiments, substrate 310 is made of a base material 313 mixed with one or more additives 314. For example, substrate 310 may be made of polyimide (a base material 313) mixed with glass fiber (an additive 314) to increase the strength of substrate 310. Substrate 310 is manufactured to have sufficient strength and stiffness to sustain stress applied on it during packaging process and during usage. In some embodiments, the Young's modulus of substrate 310 is in a range from about 5 GPa to about 100 GPa. Glass fiber has higher stiffness than Polyimide. Various amount or percentage of glass fiber may be added to polyimide to increase the strength of substrate 310. In some embodiments, the weight percentage of fiber glass in substrate 310 is in a range from about 5% to about 60%.

Base material 313 may be made of other materials, such as glass, silicon, gallium arsenide, silicon on insulator ("SOT"), epoxy, polymers (thermoset or thermoplastic), molding compound, epoxy, plastic, ceramic, or combinations thereof. Examples of plastic materials for base material 313 include, but are not limited to, polyvinyl chloride (PVC), acrylonitrile butadiene styrene (ABS) polymer, polypropylene (PP), polyethylene (PE), polystyrene (PS), polymethyl mechacrylate, (PMMA), polyethylene terephthalate (PET), polycarbonates (PC), polyphenylenesulfide (PPS).

Various additives 314 may be added to base material 313 to provide desirable properties of substrate 310. For example, a flame resistant material (an additive) can be added to base material 313. In some embodiments, the substrate 310 includes bismaleimide triazine (BT) resin, and/or FR-4 (a composite material composed of woven fiberglass cloth with an epoxy resin binder that is flame resistant). In some alternative embodiments, substrate 310 includes epoxy, resin, and glass fiber, or resin coated copper. The thickness T of substrate 310 is in a range from about 20 μm to about 500 μm.

Interposer frame 210 also includes through substrate holes (TSHs) 215 in the frame region 350. The TSHs 215 has a width $W_2$ in a range from about 50 μm to about 250 μm, in accordance with some embodiments. The TSHs has a pitch $P_2$ in a range from about 75 μm to about 500 μm, in accordance with some embodiments. In some embodiments, the pitch $P_2$ in a range from about 75 μm to about 300 μm. The TSHs 215 are covered by a conductive layer 335. In some embodiments, conductive layer 335 is made of copper or a copper alloy. The conductive layer 335 may include more than one sub-layer. Conductive layer 335 may be formed by various processes, such as sputtering, plating, or a combination of both. In some embodiments, conductive layer 335 includes coppers. In some alternative embodiments, other conductive materials may be used instead of copper. For example, conductive layer 335 may include solder, solder alloy, gold, or gold alloy, etc. Exemplary elements in a solder alloy may include Sn, Pb, Ag, Cu, Ni, bismuth (Bi), or combinations thereof. In some embodiments, conductive layer 335 has a thickness in a range from 2 μm to about 40 μm.

The conductive layer 335 also covers a portion of surfaces of substrate 310. In some embodiments, the width $W_3$ of conductive layer(s) 335 surrounding peripheries of through substrate holes (TSHs) 215 on surfaces of substrate 310 is in a range from about 2 μm to about 100 μm. Interposer frame 210 also includes a open region 340 for placing a semiconductor die 121 of FIG. 2. Substrate material in open region 340 is removed by a mechanical process, such as routing. A routing process uses a sharp tool to cut through substrate to remove substrate materials defined at a predetermined region. Other suitable mechanical processes may also be used. The width $W_4$ of region 340 is in a range from about 2 mm to about 500 mm in some embodiments.

Figure 3B:
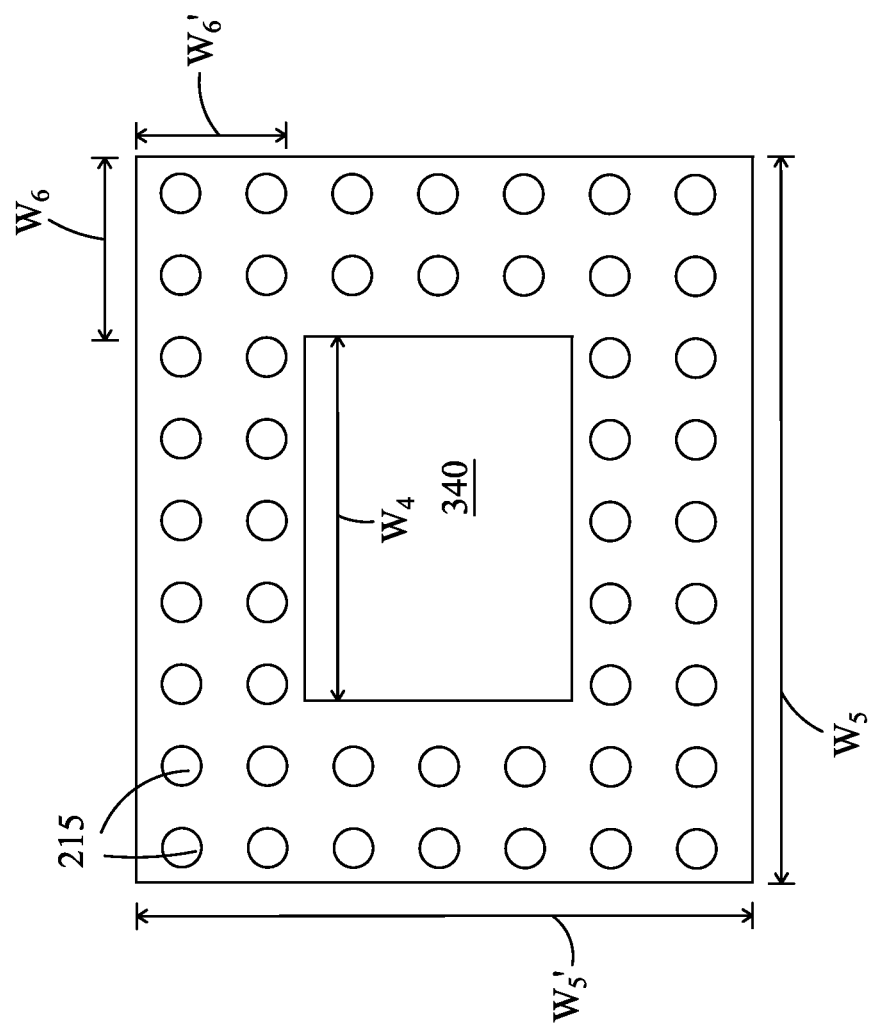
FIG. 3B is a top view of interposer frame of FIG. 3A, in accordance with some embodiments.

FIG. 3B is a top view of interposer frame 210, in accordance with some embodiments. FIG. 3B shows that through substrate holes (TSHs) 215 are distributed across the interposer frame 210. The interposer frame in FIG. 3B has a rectangular shape. In some embodiments, the width $W_5$ of interposer frame 210 in a range from about 2.5 mm to about 800 mm. In some alternative embodiments, interposer frame 210 could be in a square shape or other shapes. The frame of the interposer frame 210 of FIG. 3B has a width $W_6$ in a first direction and a width $W_6'$ in a second direction, which is perpendicular to the first direction. In some embodiments, the width $W_6$ equals the width $W_6'$. In some alternative embodiments, $W_6$ could be different from $W_6'$. For example, width $W_6$ could be wider than width $W_6'$, and the interposer frame 300 is set to have more columns (or rows) of through substrate holes (TSHs) 215 along the first direction than that along the second direction. There could be any number of rows and/or columns of through substrate holes (TSHs) 215 for interposer frame 210. The width $W_6$ or $W_6'$ is in a range from about 300 μm to about 300 mm in some embodiments.

Detailed description of exemplary mechanisms for forming interpose frame 210 can be found in Provisional U.S. Patent Application Ser. No. 61/594,141, entitled "Mechanisms for Forming Interposer Frame" and filed on Feb. 2, 2012, which is incorporated by reference herein in its entirety.

FIG. 4A is a cross-sectional view of a TSH 215 of an interposer frame 210 being placed between a bump 112 of package 110 and a bump 132 of substrate 130 in a manner depicted in FIG. 2, in accordance with some embodiments. Package 110 and substrate 130 are pressed against interposer frame 210 to allow bump 112 and bump 132 come in contact with conductive layer 335 of TSH 215. A reflow process is then performed to allow the solder materials in bumps 112 and 132 to flow and fill the TSH 215', as shown in FIG. 4B in accordance with some embodiments. TSHs 215' filled with reflowed solder behave similarly to through substrate vias (TSVs), which provides electrical connection and can help dissipate heat. The substrate 310 used to form the interposer frame 210 can be made to have a coefficient of thermal expansion (CTE) close to materials next to the substrate 310.

Figure 5A:
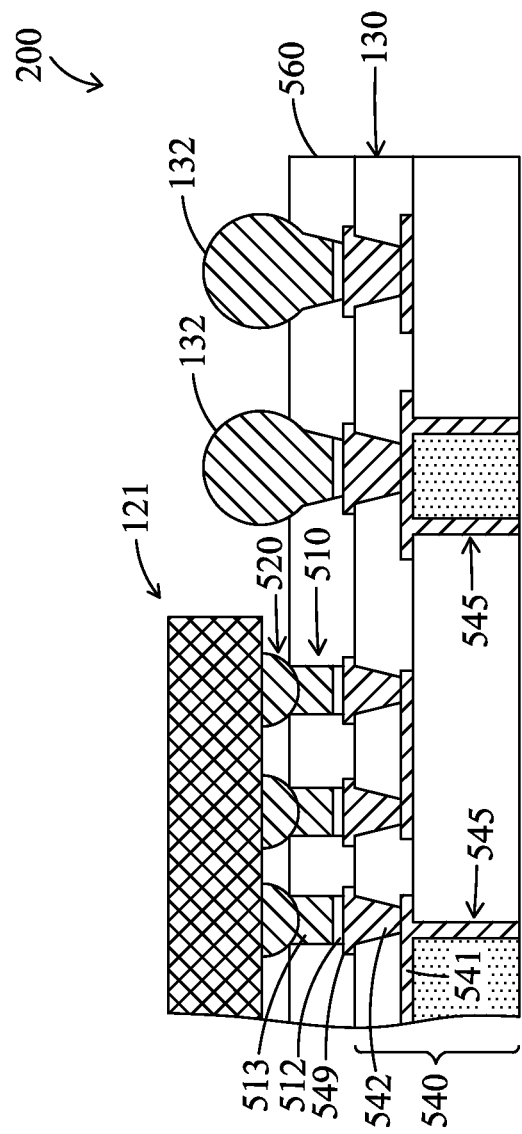
FIGS. 5A-5D are cross-sectional views of a PoP package at various manufacturing stages, in accordance with some embodiments.

FIGS. 5A-5D are cross-sectional views of a PoP package 200 at various manufacturing stages, in accordance with some embodiments. FIG. 5A shows semiconductor die 121 is bonded to substrate 130, in accordance with some embodiments. FIG. 5A shows only a portion of die 121 and a portion of substrate 130. Substrate 130 has a number of first bump structures 510, which are bonded to bumps 520 on semiconductor die 121. Bump structures 510 are separated from one another by a passivation layer 560. In some embodiments, the passivation layer 560 is made of polymers, such as polyimide. Bump structures 510 are formed over metal pad 549 and may include metal-finish layer 512 and pre-solder layer 513, in accordance with some embodiments. Bump structures 510 are electrically connected to connectors (not shown) on the other side (opposite the side where the bump structures are formed thereon) of substrate 130 through conductive structures in interconnect 540 in substrate 130. FIG. 5A only shows a portion of interconnect 540. Interconnect 540 may include metal layers 541, vias 542, and plating through holes (PTHs) 545, in accordance with some embodiments. PTHs 545 are electrically connected to connectors (not shown) on the other side substrate 130 described above. The conductive structures of interconnect 540 are insulated by dielectric material(s), which could be silicon dioxide, low-dielectric-constant dielectric, and/or doped dielectric.

Figure 5B:
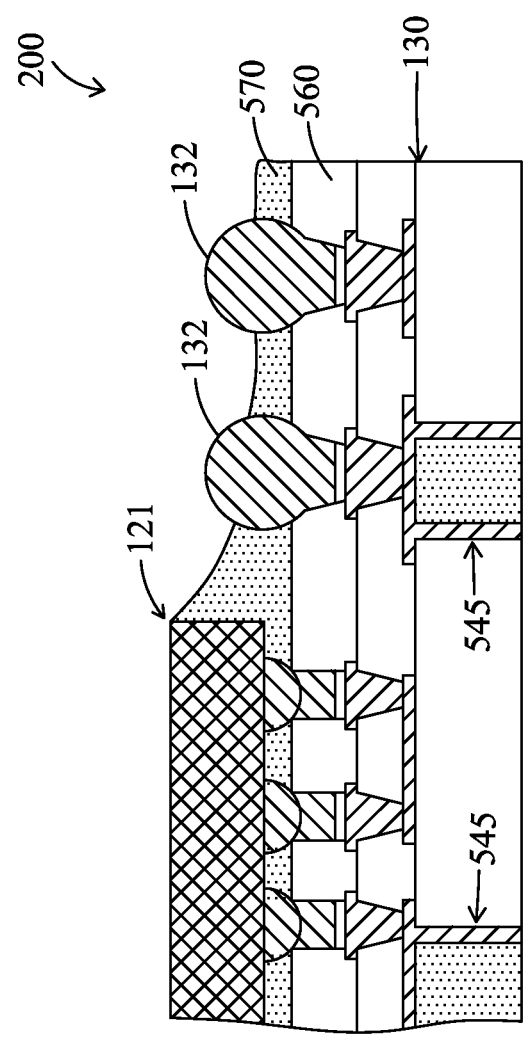

In addition, substrate 130 may have a number of second bump structures 132 surrounding die 121, shown in FIG. 5A. After die 121 is bonded to substrate 130, an underfill or molding underfill (MUF) 570 is dispensed into the gaps between the semiconductor die 121 and substrate 130 and on exposed surfaces of substrate 130 to prevent cracks from being formed in solder in bumps or balls, wherein the cracks are typically caused by thermal stresses. Underfill 570 also reduces delamination at dielectric interface For example, underfill 570 may be made of a base material, such as epoxy or resin, mixed with additives. An example of additives is $SiO_2$ filler, used to increase the strength and/or to adjust the CTE of underfill 570. After the underfill 570 is dispensed on substrate 130 bonded with die 121, the substrate is annealed to stabilize the underfill 570. FIG. 5B shows the package 200 of FIG. 5A after underfill 570 is applied, in accordance with some embodiments.

Figure 5C:
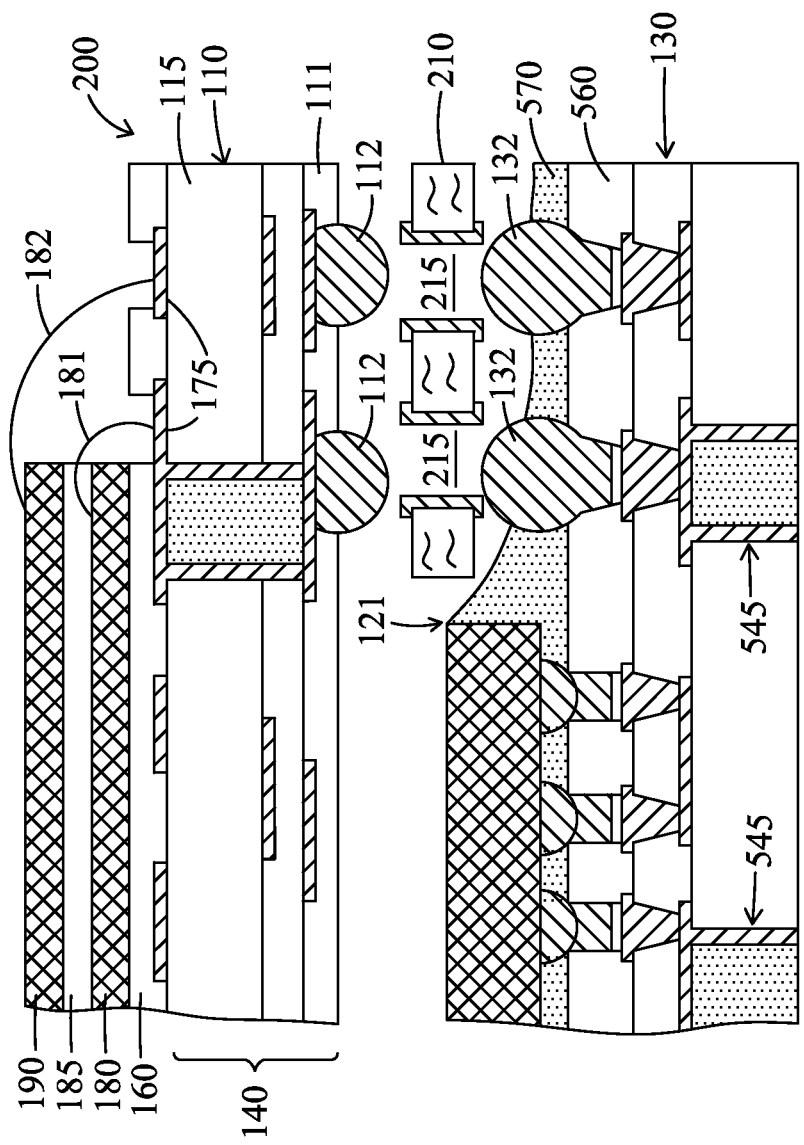
Figure 5D:
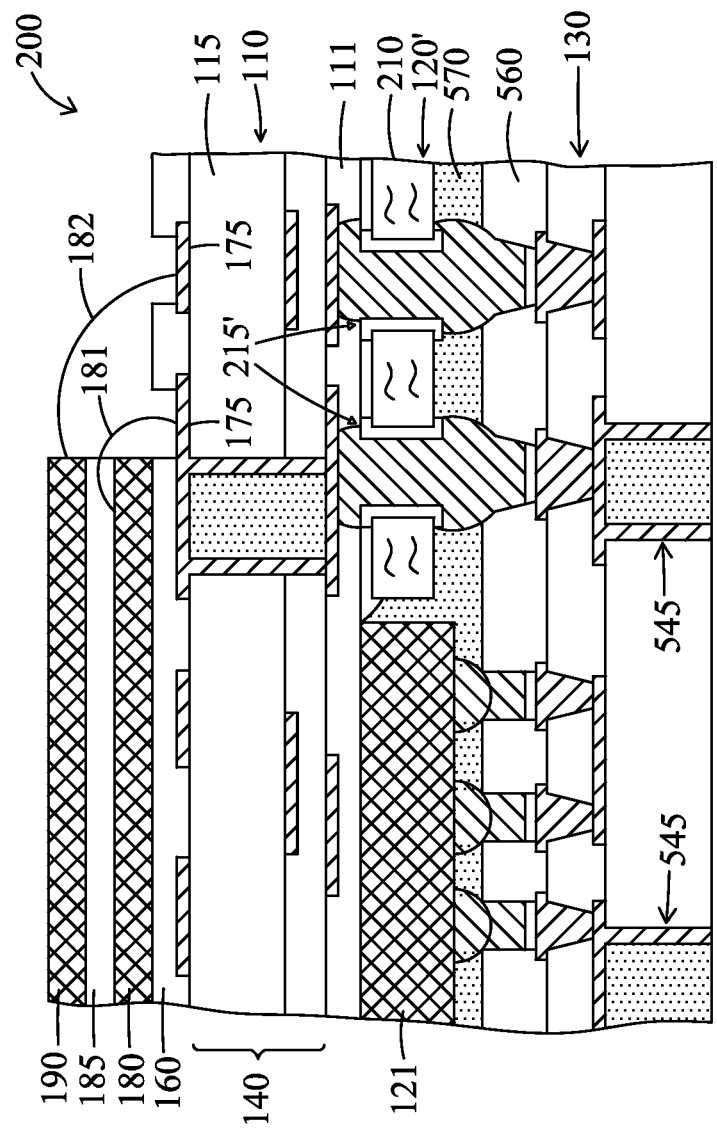

After the underfill 570 is formed on substrate 130 bonded with die 121, interposer frame 210 and package 110 are placed over substrate 130, as shown in FIG. 5C in accordance with some embodiments. Interposer frame 210 is positioned to have its opening 340 surrounding die 121. In addition, TSHs 215 are positioned directly over bumps 132 on substrate 130. FIG. 5C also shows that bumps 112 on package 110 are also aligned over TSHs 215, which have bumps 132 underneath. Afterwards, package 110 and substrate 130 are pressed against interposer frame 210 and the entire package is then reflowed to allow solder material in bumps 112 and bumps 132 to fill the spaces in TSHs 215. The solder material in bumps 112 comes in contact the solder material in bumps 132 to fill the TSHs 215, which becomes through substrate vias (TSVs) 215', as shown in FIG. 5D in accordance with some embodiments. The bumps 112 of package 110 are also isolated from one another by a passivation layer 111. FIG. 5D shows that package 110 has two semiconductor chips 180 and 190, which are stacked on each other and are separated by a glue layer 185. FIG. 5D also shows that chips 180 and 190 are electrically connected to contacts 175 on substrate 115 of package 110 via wires 181 and 182. Substrate 115 includes interconnect 140. Interconnect 140 may include metal layers 141, vias (not shown), and plating through holes (PTHs) 145, in accordance with some embodiments. The conductive structures of interconnect 140 are insulated by dielectric material(s), which could be silicon dioxide, low-dielectric-constant dielectric, and/or doped dielectric. Contacts 175 are separated from each other by a passivation layer 160, which is made of a dielectric material. In some embodiments, passivation layer 160 is made of polymers, such as polyimide.

Substrate 310 of interposer frame 210 comes in contact with molding compound or underfill 570, which surrounds semiconductor chip 121. Underfill 570 also comes in contact with passivation layer 560 of substrate 130 and passivation layer 111 of package 110. The CTE of underfill 570 is selected to be close to the CTE of the passivation layers 560 and 111. As mentioned above, the passivation layers 560 and 111 may be made of polymers, such as polyimide. In some embodiments, CTEs of passivation layers 560 and 111 are in a range from about 3 ppm/° C. to about 50 ppm/° C. In some embodiments, CTE of underfill 570 is in a range from about 3 ppm/° C. to about 50 ppm/° C. The base material 313 and additives 314 can be selected to achieve a CTE of substrate 310 of interposer frame 210 to be close to the CTEs of underfill 570, passivation layer 560, and passivation layer 111. In some embodiments, the CTE of substrate 310 is in a range from about 3 ppm/° C. to about 50 ppm/° C.

Due to better matching of CTEs of substrate 310 of interposer frame 210 and the surrounding materials (such as underfill 570 and passivation layers 560, 111), the PoP package 200 can withstand better thermal cycling during packaging process and during usage. Packages using TMVs, such as PoP package of FIGS. 1A and 1B, could have delamination of solder joints due to CTE mismatch. By using an interposer frame with better CTE match, the problem with delaminating of solder joins could be greatly reduced, if not entirely solved. In addition, the TSVs 215' formed by the TSHs 215 are better insulated from each other than the TMVs shown in FIG. 1B. The insulating layer, made of substrate 310, between TSVs 215' has about the same widths at the top and at the bottom of TSVs 215'. In contrast, the isolation regions 117 between connectors 115 in FIG. 1B are relatively thin in the top portions 117', which increase the risk of shorting between connectors 115.

In addition, by adding strength enhancer, such as fiber glass, the strength of substrate 310 is better than the strength of molding compound of package 120. As a result, PoP package 200 using interposer frame 210 described above would perform better under drop test than PoP package of FIGS. 1A and 1B. Drop test is a test of dropping a package from a certain height and observe if the package can survive the impact with the ground. Drop test is important for hand-held devices.

Figure 6A:
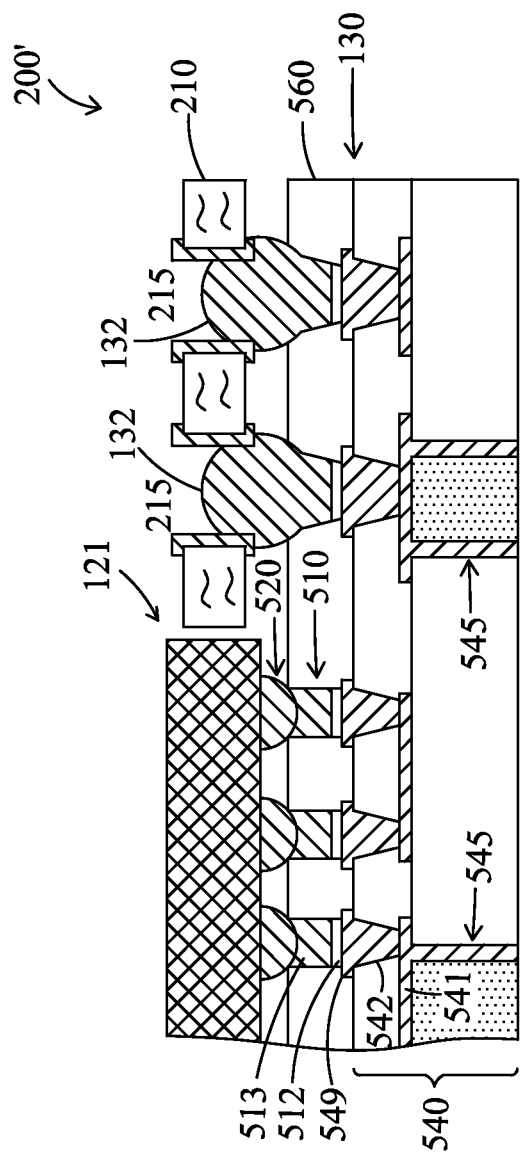
FIGS. 6A-6C are cross-sectional views of a PoP package at various manufacturing stages, in accordance with some other embodiments.
Figure 6B:
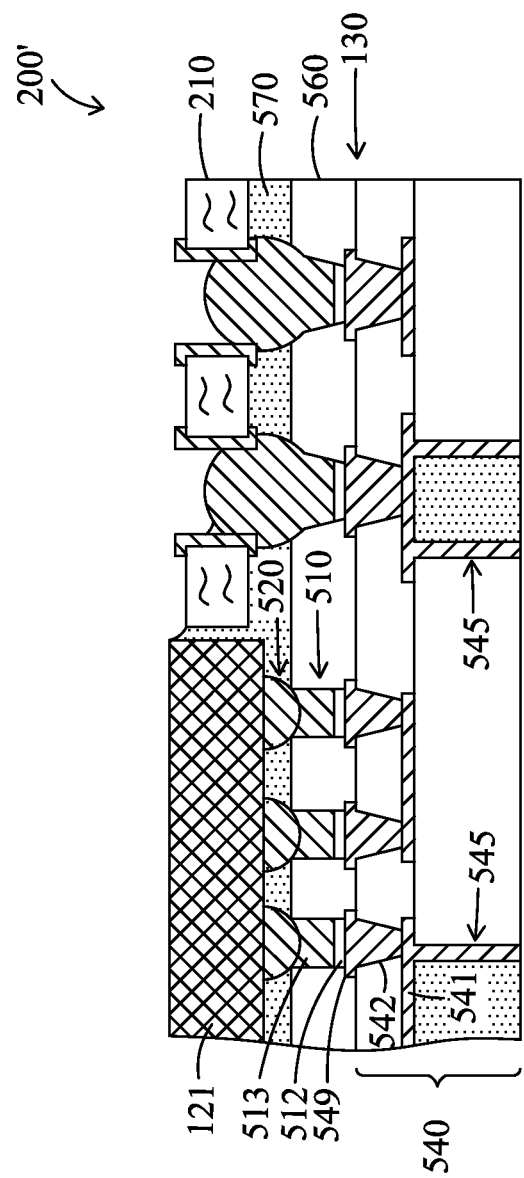
Figure 6C:
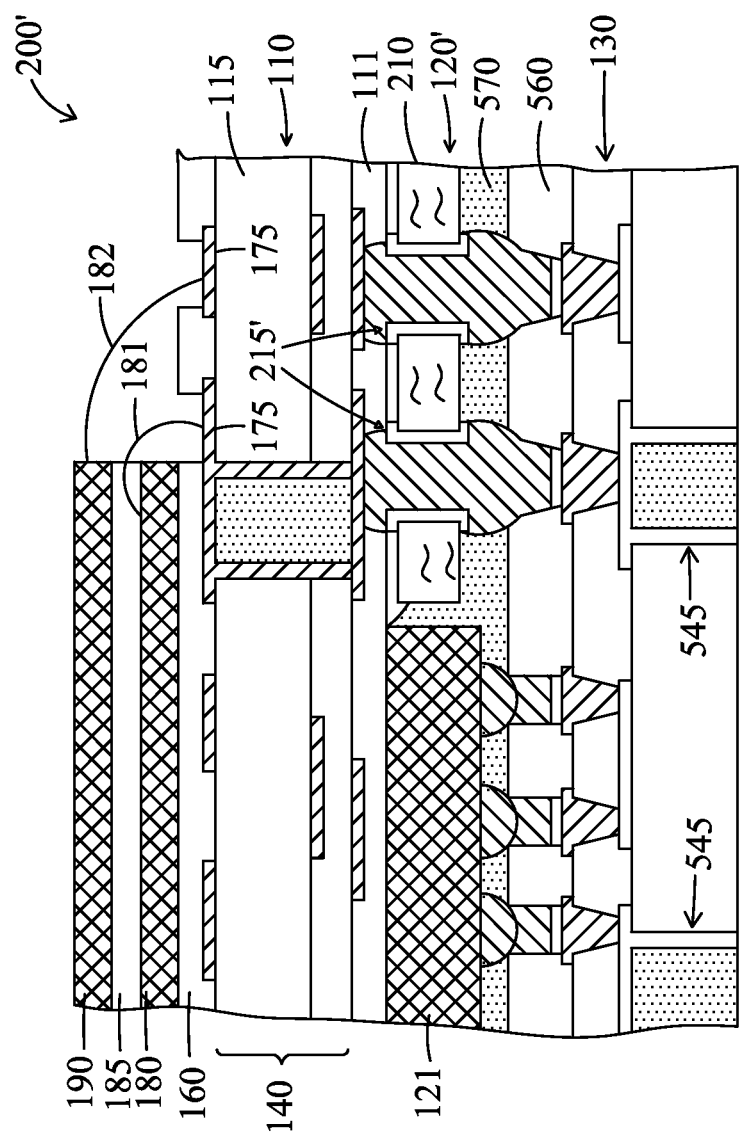

FIGS. 6A-6C are cross-sectional views of a PoP package 200' using an interposer frame at various manufacturing stages, in accordance with some other embodiments. FIG. 6A shows semiconductor die 121 and interposer frame 210 are bonded to substrate 130, in accordance with some embodiments. The semiconductor die 121 could be bonded to substrate 130 before interposer frame 210 being bonded to substrate 130 or afterwards. Alternatively, the semiconductor die 121 and the interposer frame 210 can be bonded to substrate 130 simultaneously. Similar to PoP package 200, bumps 132 are aligned with TSHs 215. After bonding the interposer frame 210 to substrate 130, part of solder material on bumps 132 flows into the TSHs 215, as shown in FIG. 6A, in accordance with some embodiments.

Afterwards, an underfill 570 is applied to the gaps (or space) between substrate 130, die 121 and interposer frame 310 to prevent cracks from being formed in solder in bumps or balls, wherein cracks are typically caused by thermal stresses. As mentioned above, underfill 570 also reduces delamination at dielectric interface. After the underfill 570 is applied, the partially packaged structure, with substrate 130, die 121, and interposer frame 210, is annealed (or cured) to stabilize the underfill 570. FIG. 6B shows the bonded structure described above after underfill 570 has been applied and annealed, in accordance with some embodiments.

Afterwards, package 110 is bonded to the packaged structure 200' of FIG. 6B, as shown in FIG. 6C in accordance with some embodiments. Bumps 112 on package 110 are aligned with TSHs 215 and are bonded to bumps 132 of substrate 130 to fill TSHs 215, which become TSVs 215', in accordance with some embodiments. The structures and layers of PoP package 200' shown in FIG. 6C are similar to those of FIG. 5D, in accordance with some embodiments. As a result, the benefits using interposer frame 210 described above for PoP package 200 also apply.

Embodiments of mechanisms of utilizing an interposer frame to form a package using package on package (PoP) technology are provided in this disclosure. The interposer frame is formed by using a substrate with one or more additives to adjust the properties of the substrate. The interposer frame has through substrate holes (TSHs) lined with conductive layer to form through substrate vias (TSVs) with solder balls on adjacent packages. The interposer frame enables the reduction of pitch of TSVs, mismatch of coefficients of thermal expansion (CTEs), shorting, and delamination of solder joints, and improves mechanical strength of the PoP package.

In some embodiments, a semiconductor package is provided. The semiconductor package includes a substrate and an interposer frame. The interposer frame includes a plurality of through substrate holes (TSHs) and an opening defined therein. The semiconductor package also includes a semiconductor die bonded to the substrate and disposed in the opening within the interposer frame. The substrate has a plurality of bumps aligned with the plurality of TSHs, and a portion of solder material of the plurality of bumps fill at least partially the plurality of TSHs.

In some other embodiments, a package is provided. The package includes a substrate, and an interposer frame, wherein the interposer frame includes a plurality of through substrate holes (TSHs) and an opening defined therein. The package also includes a semiconductor die bonded to the substrate and disposed in the opening within the interposer frame. The substrate has a plurality of bumps aligned with the plurality of TSHs, and a portion solder material on the plurality of bumps fill at last partially the plurality of TSHs. The package further includes a packaged die with a plurality of bumps, and the plurality of bumps of the package die are bonded to the plurality of bumps of the substrate. The plurality of TSHs are filled with solder material from the plurality of bumps of the package and from the plurality of bumps of the packaged die.

In yet some other embodiments, a method of forming a package on package structure with an interposer frame is provided. The method includes bonding a semiconductor die and an interposer frame to a substrate, and the interposer frame surrounds the semiconductor die. The semiconductor die is disposed in an opening of the interposer frame, and the interposer frame has a plurality of TSHs. The plurality of TSHs are aligned with a plurality of bumps on the substrate. The method also includes positioning a packaged die over the semiconductor die and the interposer frame. The packaged die has a plurality of bumps aligned with the plurality of TSHs of the interposer. The method further includes performing a reflow process to allow solder of the plurality of bumps of the substrate and the solder of the plurality of bumps of the packaged die to fill the plurality of TSHs.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor package, comprising:
   a substrate;
   an interposer frame, wherein the interposer frame includes a plurality of through substrate holes (TSHs) and an opening defined therein, wherein at least one TSH of the plurality of TSHs is lined with a conductive layer, wherein a thickness of the conductive layer is in a range from about 2 microns (μm) to about 40 μm; and
   a semiconductor die bonded to the substrate and disposed in the opening within the interposer frame, wherein the substrate has a plurality of bumps aligned with the plurality of TSHs, and wherein a portion of solder material of the plurality of bumps fill at least partially the plurality of TSHs.

2. The semiconductor package of claim 1, further comprising:
   an underfill between the interposer frame and the semiconductor die.

3. The semiconductor package of claim 1, wherein the interposer frame includes a base material, wherein the base material includes a material comprising glass, silicon, gallium arsenide, silicon on insulator, epoxy, polymers, molding compound, epoxy, plastic, or ceramic.

4. The semiconductor package of claim 3, wherein the base material is mixed with at least one additive, wherein the at least one additive includes fiber glass.

5. The semiconductor package of claim 1, wherein a pitch between adjacent TSHs of the plurality of the TSHs is in a range from about 75 μm to about 500 μm.

6. The semiconductor package of claim 1, wherein a TSH of the plurality of TSHs has a width in a range from about 50 μm to about 200 μm.

7. The semiconductor package of claim 1, wherein a thickness of the interposer frame is in a range from about 20 μm to about 500 μm.

8. The semiconductor package of claim 1, further comprising:
   a packaged die with a plurality of bumps, wherein the plurality of bumps of the package die are bonded to the plurality of bumps of the substrate.

9. The semiconductor package of claim 1, wherein the substrate has a plating through hole.

10. The semiconductor package of claim 8, wherein the package die includes a semiconductor die.

11. The semiconductor package of claim 1, wherein the interposer frame has a substrate, and the substrate of the interposer frame has a coefficient of thermal expansion in a range from about 3 ppm/° C. to about 50 ppm/° C.

12. A package, comprising:
   a substrate,
   an interposer frame, wherein the interposer frame includes a plurality of through substrate holes (TSHs) and an opening defined therein, wherein the interposer frame has a substrate, and the substrate of the interposer frame has a coefficient of thermal expansion in a range from about 3 ppm/° C. to about 50 ppm/° C.;
   a semiconductor die bonded to the substrate and disposed in the opening within the interposer frame, wherein the substrate has a plurality of bumps aligned with the plurality of TSHs; and
   a packaged die with a plurality of bumps, wherein the plurality of bumps of the package die are bonded to the plurality of bumps of the substrate, wherein the plurality of TSHs are filled with solder material from the plurality of bumps of the package and from the plurality of bumps of the packaged die.

13. A semiconductor package, comprising:
   a substrate, the substrate comprises:
      a plurality of solder bumps;
   an interposer frame bonded to the substrate, the interposer frame comprises:
      a plurality of through substrate holes (TSHs), at least one TSH of the plurality of TSHs is lined with a conductive layer, wherein each TSH of the plurality of TSHs is aligned with a respective solder bump of the plurality of solder bumps, and the solder bump extends into the respective TSH; and
      an opening separate from the plurality of TSHs, wherein a width of the opening in the interposer frame ranges from about 2 millimeters (mm) to about 500 mm; and
   a semiconductor die bonded to the substrate and disposed in the opening within the interposer frame.

14. The semiconductor package of claim 13, wherein the interposer frame further comprises a conductive liner disposed along sidewalls of each TSH of the plurality of TSHs, wherein the conductive line extends a first distance along a top surface of the interposer frame and a second distance along a bottom surface of the interposer frame, and the top surface is opposite the bottom surface.

15. The semiconductor package of claim 14, wherein the first distance and the second distance range from about 2 microns (μm) to about 100 μm.

16. The semiconductor package of claim 13, wherein the opening in the interposer frame is spaced from an edge of the interposer frame by a distance ranging from about 300 μm to about 300 millimeters (mm).

17. The semiconductor package of claim 13, wherein the interposer frame comprises:
   a base material; and
   an additive in the base material, wherein a weight percentage of the additive in the interposer frame ranges from about 5 weight % to about 60 weight %.

18. The package of claim 12, wherein a pitch of the plurality of TSHs is in a range from about 75 μm to about 500 μm.

19. The semiconductor package of claim 1, wherein the conductive layer extends along at least one of a top surface of the interposer or a bottom surface of the interposer, wherein the top surface is opposite the bottom surface.

20. The semiconductor package of claim 19, wherein a length of the conductive layer along the top surface or the bottom surface ranges from about 2 μm to about 100 μm.

* * * * *